US012336351B2

(12) United States Patent
Kojima et al.

(10) Patent No.: US 12,336,351 B2
(45) Date of Patent: Jun. 17, 2025

(54) METHOD OF MANUFACTURING LIGHT-EMITTING DEVICE, AND LIGHT-EMITTING DEVICE

(71) Applicant: NICHIA CORPORATION, Anan (JP)

(72) Inventors: Atsushi Kojima, Tokushima (JP); Kenji Ozeki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 605 days.

(21) Appl. No.: 17/551,389

(22) Filed: Dec. 15, 2021

(65) Prior Publication Data

US 2022/0199877 A1  Jun. 23, 2022

(30) Foreign Application Priority Data

Dec. 18, 2020 (JP) ................................. 2020-209994
Sep. 9, 2021 (JP) ................................. 2021-146658

(51) Int. Cl.
*H10H 20/857* (2025.01)
*H10H 20/01* (2025.01)
*H10H 29/14* (2025.01)

(52) U.S. Cl.
CPC .......... *H10H 20/857* (2025.01); *H10H 20/01* (2025.01); *H10H 29/142* (2025.01); *H10H 20/0364* (2025.01)

(58) Field of Classification Search
None
See application file for complete search history.

(56) References Cited

U.S. PATENT DOCUMENTS

2009/0002604 A1  1/2009 Morimoto
2009/0140630 A1  6/2009 Kijima et al.
(Continued)

FOREIGN PATENT DOCUMENTS

JP  2006-309209 A  11/2006
JP  2008-283155 A  11/2008
(Continued)

OTHER PUBLICATIONS

JP 2012079574A, Horiuchi et al, Illuminating Device Manufacturing Method for Backlight Apparatus, Involves Extracting Light Emitting Devices from Ranks Located Symmetrically With Respect to Target Chromaticity, Apr. 19, 2012 (Year: 2012).*

*Primary Examiner* — Alexander G Ghyka
(74) *Attorney, Agent, or Firm* — Foley & Lardner LLP

(57) ABSTRACT

A method of manufacturing a light-emitting device includes: a providing step including providing a plurality of light sources, each of the light sources having an upper surface including a light-emitting portion, a lower surface opposite to the upper surface, and lateral surfaces between the upper surface and the lower surface, wherein each of the light sources includes an external connection terminal at the lower surface, and wherein the plurality of light sources are ranked in terms of at least one of luminous flux or chromaticity; an extracting step including extracting a plurality of light sources in a desired rank from the plurality of light sources; and a bonding step including bonding the lateral surfaces of adjacent ones of the plurality of extracted light sources via a bonding member such that the upper surfaces and the lower surfaces of the light sources are exposed from the bonding member and such that the bonding member is spaced apart from the external connection terminals.

18 Claims, 10 Drawing Sheets

(56) References Cited

U.S. PATENT DOCUMENTS

| | | |
|---|---|---|
| 2012/0161164 A1 | 6/2012 | Kim |
| 2013/0187174 A1 | 7/2013 | Tischler |
| 2015/0262979 A1 | 9/2015 | Yamauchi et al. |
| 2018/0033926 A1 | 2/2018 | Nonogawa |
| 2019/0355702 A1* | 11/2019 | Herner .................. H01L 33/30 |
| 2020/0212016 A1 | 7/2020 | Sakamoto et al. |
| 2020/0310019 A1 | 10/2020 | Hayashi |
| 2021/0332966 A1 | 10/2021 | Biwa |

FOREIGN PATENT DOCUMENTS

| | | |
|---|---|---|
| JP | 2011-228356 A | 11/2011 |
| JP | 2012-009656 A | 1/2012 |
| JP | 2013-045839 A | 3/2013 |
| JP | 2013-183042 A | 9/2013 |
| JP | 2015-506591 A | 3/2015 |
| JP | 2015-126209 A | 7/2015 |
| JP | 2015-195356 A | 11/2015 |
| JP | 2018-019032 A | 2/2018 |
| JP | 2018-148075 A | 9/2018 |
| JP | 2020-107763 A | 7/2020 |
| JP | 2020-119868 A | 8/2020 |
| JP | 2020-120057 A | 8/2020 |
| JP | 2020-166938 A | 10/2020 |
| WO | WO-2013/161934 A1 | 10/2013 |
| WO | WO-2020/085032 A1 | 4/2020 |

* cited by examiner

METHOD OF MANUFACTURING LIGHT-EMITTING DEVICE, AND LIGHT-EMITTING DEVICE

CROSS-REFERENCE TO RELATED APPLICATION

This application claims priority to Japanese Patent Application No. 2020-209994, filed on Dec. 18, 2020, and Japanese Patent Application No. 2021-146658, filed on Sep. 9, 2021. The disclosures of these applications are hereby incorporated by reference in their entireties.

BACKGROUND

The present disclosure relates to a method of manufacturing a light-emitting device and the light-emitting device.

A light source device has been disclosed that includes a collective substrate and a plurality of light-emitting portions. The collective substrate has a plurality of sections divided by partitions. The light-emitting portions are disposed in the sections and have different emission colors (see Japanese Patent Publication No. 2013-183042).

SUMMARY

According to certain embodiments of the present disclosure, an efficient method of manufacturing a light-emitting device including a plurality of light-emitting portions, and the light-emitting device can be provided.

A method of manufacturing a light-emitting device according to an embodiment of the present disclosure includes: a providing step in which a plurality of light sources are provided, each of the light sources having an upper surface including a light-emitting portion, a lower surface opposite to the upper surface and provided with an external connection terminal, and lateral surfaces between the upper surface and the lower surface, the plurality of light sources being ranked in terms of at least one of luminous flux and chromaticity; an extracting step in which a plurality of light sources in a desired rank are extracted from the plurality of light sources; and a bonding step in which the lateral surfaces of adjacent ones of the plurality of extracted light sources are bonded via a bonding member such that the upper surfaces and the lower surfaces of the light sources are exposed from the bonding member and such that the bonding member is spaced apart from the external connection terminals.

A light-emitting device according to an embodiment of the present disclosure includes a plurality of light sources; and a bonding member bonding the plurality of light sources. Each of the light sources having an upper surface including a light-emitting portion, a lower surface opposite to the upper surface and provided with an external connection terminal, and a lateral surface between the upper surface and the lower surface. Lateral surfaces of adjacent ones of the plurality of light sources are bonded via a bonding member such that the upper surfaces and the lower surfaces are exposed from the bonding member and such that the bonding member are spaced apart from the external connection terminals.

The present disclosure allows for providing an efficient method of manufacturing a light-emitting device, and the light-emitting device including a plurality of light-emitting portions.

DETAILED DESCRIPTION

Figure 1A:
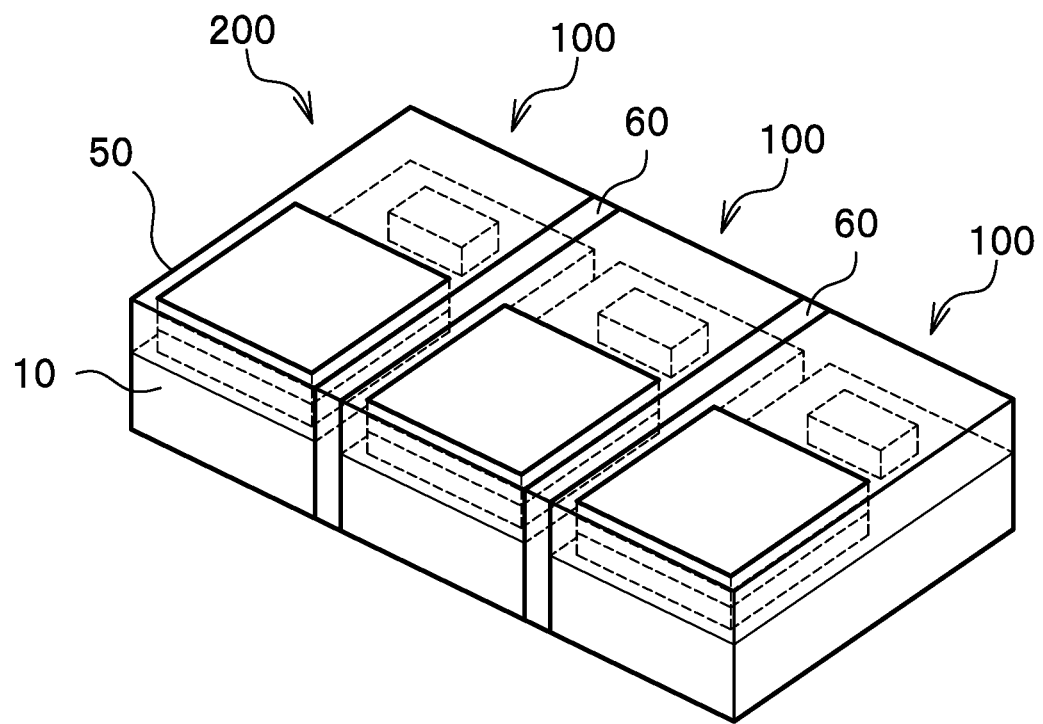
FIG. 1A is a schematic perspective view illustrating a configuration of a light-emitting device according to a first embodiment.

Certain embodiments are described below with reference to the accompanying drawings. The embodiments described below are intended to exemplify methods of manufacturing light-emitting devices and the light-emitting devices to give a concrete form to the technical idea of the present invention. However, the present invention is not limited to the embodiments described below. Unless specifically stated otherwise, descriptions of the sizes, materials, shapes, and relative positions of constituent components in the embodiments described below are not intended to limit the scope of the present invention to those descriptions, but are rather only examples. Sizes or positional relationships of components illustrated in the drawings may be exaggerated in order to clarify the descriptions. End views showing only cut-surfaces may be used as the cross-sectional views. The number of light-emitting elements shown in each drawing is selected as an example to facilitate understanding of the configuration. Unless specifically stated otherwise, the term "cover" used in embodiments includes not only being in direct contact but also includes indirect covering, such as covering via another member.

First Embodiment

Figure 1B:
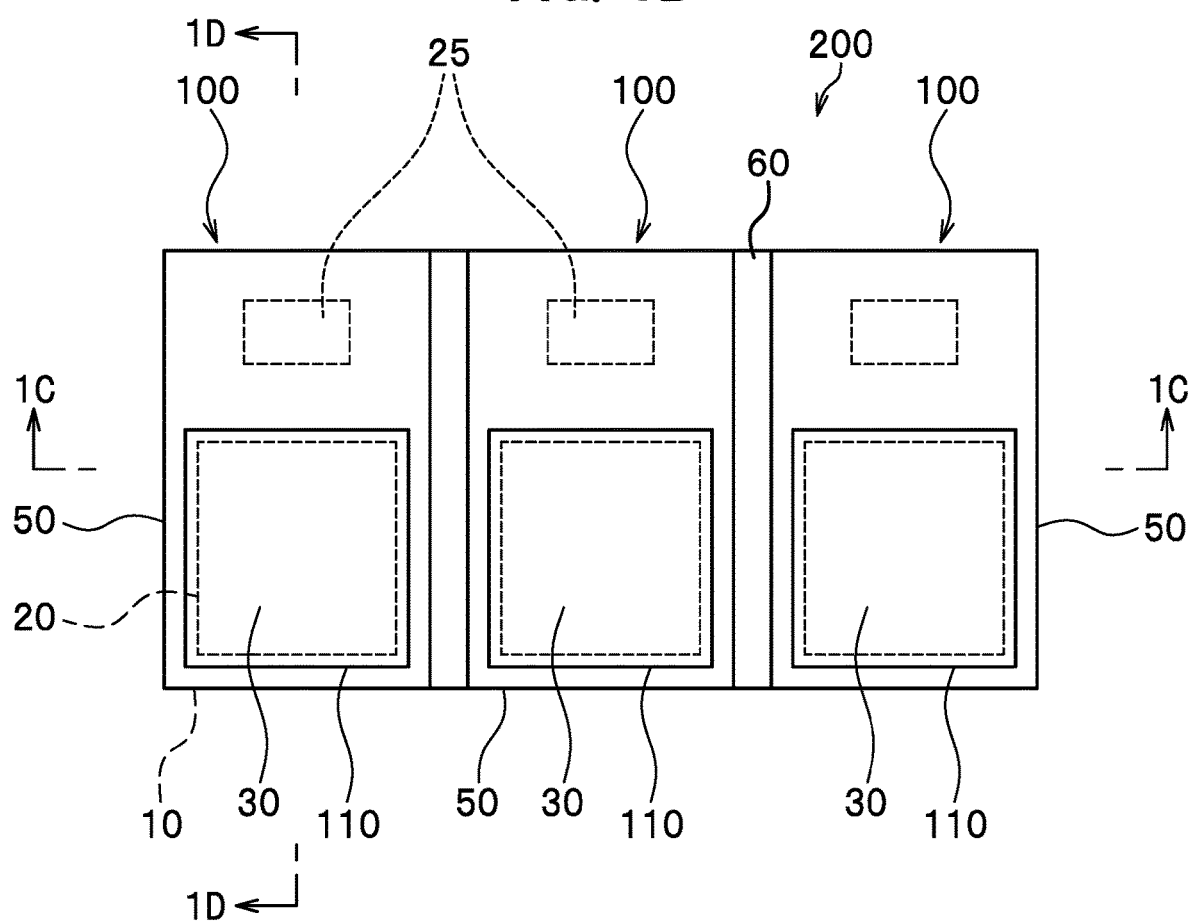
FIG. 1B is a schematic plan view illustrating the configuration of the light-emitting device according to the first embodiment.
Figure 1C:
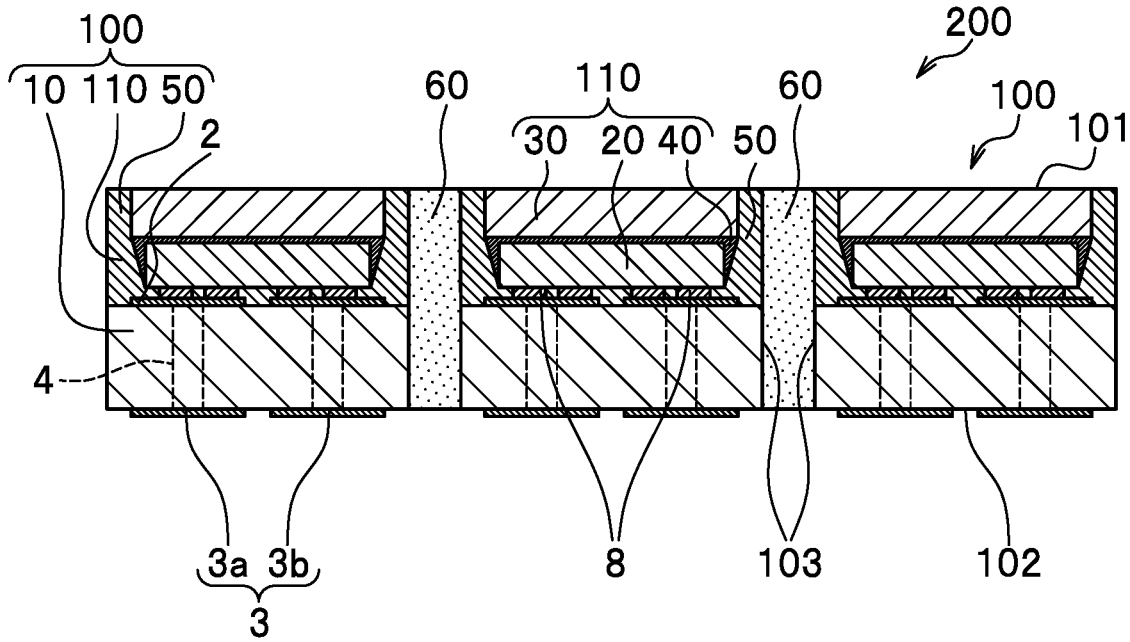
FIG. 1C is a schematic cross-sectional view taken along line IC-IC of FIG. 1B.
Figure 1D:
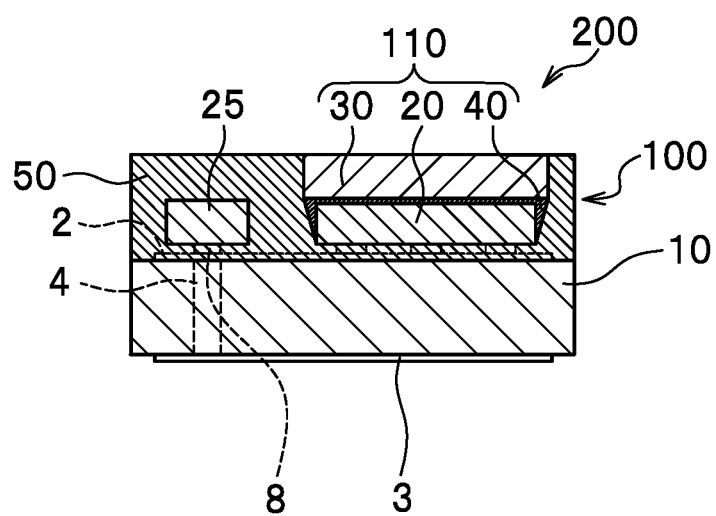
FIG. 1D is a schematic cross-sectional view taken along line ID-ID of FIG. 1B.
Figure 1E:
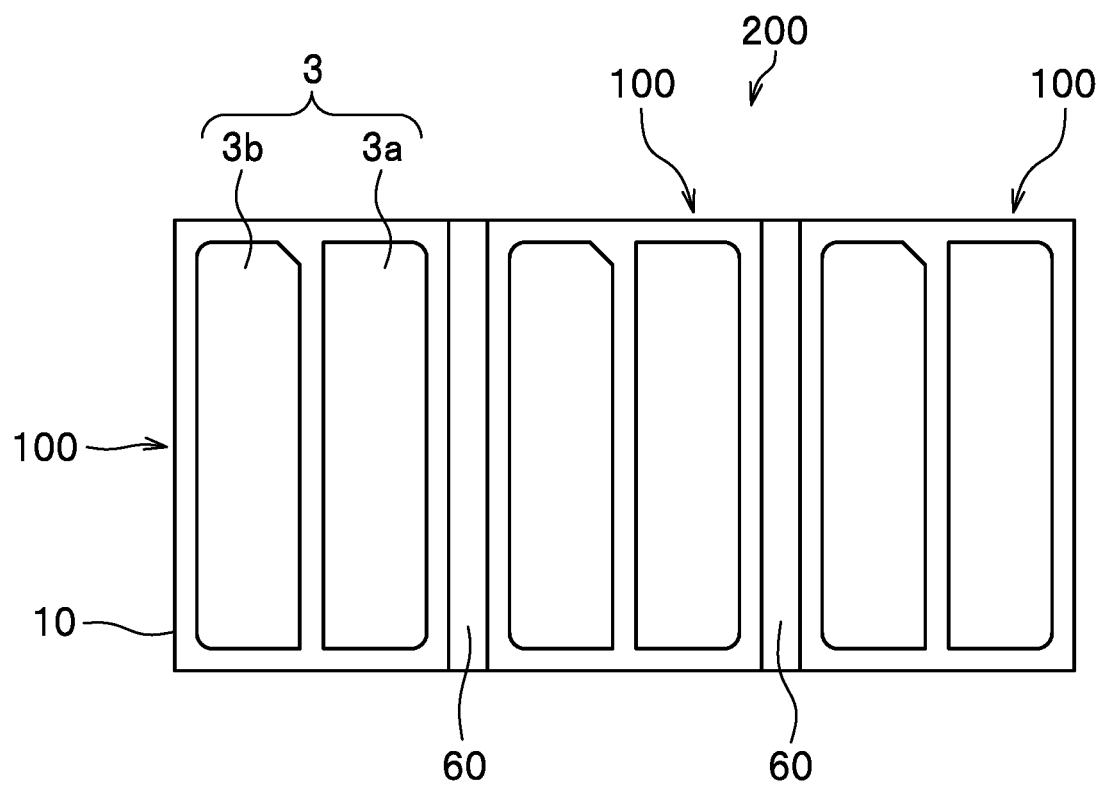
FIG. 1E is a schematic bottom view illustrating the configuration of the light-emitting device according to the first embodiment.
Figure 1F:
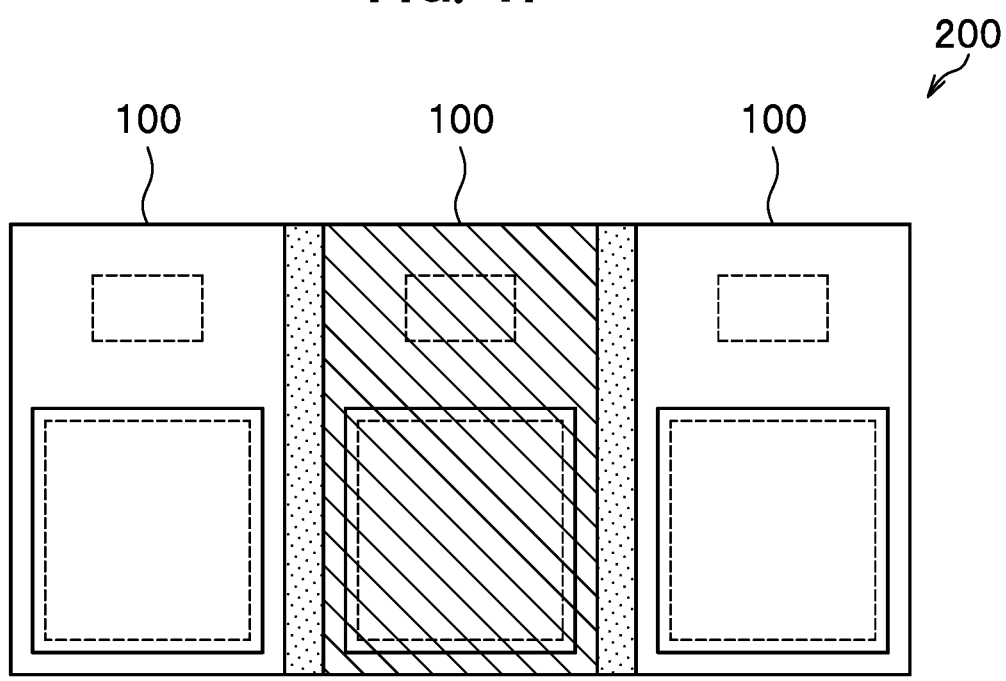
FIG. 1F schematically shows an example of the light-emitting device according to the first embodiment.

FIG. 1A is a schematic perspective view illustrating the configuration of a light-emitting device according to a first embodiment. FIG. 1B is a schematic plan view illustrating the configuration of the light-emitting device according to the first embodiment. FIG. 1C is a schematic cross-sectional view taken along the line IC-IC of FIG. 1B. FIG. 1D is a schematic cross-sectional view taken along the line ID-ID of FIG. 1B. FIG. 1E is a schematic bottom view illustrating the configuration of the light-emitting device. FIG. 1F schematically shows a combination of ranked light sources.

Light-Emitting Device

A light-emitting device 200 includes a plurality of light sources 100, and bonding members 60, each bonding corresponding ones of the light sources 100. Each of the light sources 100 has an upper surface 101 including a light-emitting portion 110, a lower surface 102 opposite to the upper surface 101 and provided with external connection terminals 3, and lateral surfaces 103 between the upper surface 101 and the lower surface 102. For example, the light source 100 has a substantially rectangular parallelepiped shape. Lateral surfaces 103 of adjacent light sources 100 are bonded with the bonding members 60 disposed therebetween such that the upper surfaces 101 and the lower surfaces 102 of the light sources 100 are exposed from the bonding members 60 and such that the bonding members 60 are spaced apart from the external connection terminals 3, which constitutes the single light-emitting device 200. In this example, lateral surfaces of three light sources 100 having the same emission color are bonded together such that the light-emitting portions 110 are arranged in one row and three columns to constitute the light-emitting device 200.

The light sources 100 of the light-emitting device 200 may have the same emission color or different emission colors. For example, when using a combination of light sources having the same emission color, unevenness in emission color of the light-emitting portions of the light-emitting device can be reduced by selecting and combining light sources in closer chromaticity ranks. By combining different emission colors, a multicolor light-emitting device can be obtained.

Light Source

The light source 100 has a substantially rectangular parallelepiped shape and includes the light-emitting portion in the upper surface and the external connection terminals 3 on the lower surface for connection to an external device. The light source 100 includes a substrate 10, a light-emitting element disposed on the substrate 10, a light-transmissive member 30 covering the light-emitting element, and a covering member 50 covering the lateral surfaces of the light-transmissive member, the upper surface of the light-transmissive member being exposed from the covering member 50. The upper surface of the light-transmissive member 30 exposed from the covering member 50 serves as the light-emitting portion of the light source 100, and light from the light-emitting element is emitted to the outside through the upper surface of the light-transmissive member 30. The covering member 50 constitutes a portion of the upper surface and at least a portion of outer lateral surfaces of the light source.

Substrate

The substrate 10 is a member on which a light-emitting element 20 is to be disposed. For example, the substrate 10 has a substantially rectangular shape in a plan view. The substrate 10 may have a flat plate shape or may define a recess in the upper surface to accommodate the light-emitting element 20.

The substrate 10 includes a plurality of wirings that function as electrodes for the light source and as an insulating base material. Examples of the substrate 10 include a ceramic substrate including a wiring layer and a resin package in which lead electrodes and resin are integrally molded.

For the base material, a thermoplastic resin such as polyphthalamide (PPA), poly(phenylene sulfide) (PPS), or a liquid crystal polymer or a thermosetting resin such as an epoxy resin, a silicone resin, a modified epoxy resin, a modified silicone resin, a urethane resin, or a phenolic resin can be used. In the case in which a ceramic is used for the base material, aluminum oxide, aluminum nitride, mullite, silicon carbide, or silicon nitride is preferably used.

Examples of the wirings include metals such as Fe, Cu, Ni, Al, Ag, Au, Pt, Ti, W, and Pd and alloys containing at least one of these metals. The wirings may include a plating layer on surfaces thereof. For example, Au, Ag, Cu, Pt, or an alloy containing one of these metals can be used for the plating layer.

The wirings include upper-surface wirings 2, the external connection terminals 3, and inner-layer wirings. The upper-surface wirings 2 are disposed on the upper surface of the substrate and connected to the light-emitting element 20. The external connection terminals 3 are disposed on the lower surface opposite to the upper surface and electrically connected to an external power source. Each of the inner-layer wirings electrically connects a corresponding one of the upper-surface wirings 2 to a corresponding one of the external connection terminals 3. For example, each of the inner-layer wirings includes vias 4 extending through the base material.

Light-Emitting Element and Protective Element

For the light-emitting element 20, a light-emitting diode is preferably used. Any appropriate shape, size, and the like of the light-emitting element 20 can be selected. A light-emitting element 20 having any appropriate wavelength can be selected. For example, a light-remitting element containing a nitride semiconductor ($In_XAl_YGa_{1-X-Y}N$, where $0 \leq X$, $0 \leq Y$, $X+Y \leq 1$), ZnSe, or GaP can be used for a blue or green light-emitting element 20. For a red light-emitting element 20, a nitride semiconductor element, an element including GaAlAs, AlInGaP, or the like can be used. When a light-emitting element is used in combination with a wavelength conversion member, it is preferable to use a light-emitting element containing a nitride semiconductor adapted to emit short-wavelength light for efficient excitation of the wavelength conversion member.

For example, the light-emitting element 20 includes a semiconductor layer on a light-transmissive supporting substrate such as a sapphire growth substrate. The light-emitting element 20 does not necessarily include the supporting substrate.

The light-emitting element 20 includes positive and negative element electrodes. The positive and negative element electrodes may be disposed on the same surface side or different surface sides. A light-emitting element 20 with a desired electrode configuration can be appropriately selected according to the form of the substrate used for the light source and the like. The light-emitting element 20 is electrically connected to the upper-surface wirings of the substrate by respective electroconductive connecting members 8. Examples of the electroconductive connecting members 8 include eutectic solder, electroconductive paste, sintered metal, bumps, and wires.

For a protective element 25, for example, a Zener diode can be used. For example, the protective element 25 having positive and negative electrodes on a single surface is mounted on the upper-surface wirings of the substrate 10 via electroconductive connecting members. The light source 100 does not necessarily include the protective element 25.

Light-Transmissive Member

The light-transmissive member 30 covers the light-emitting element 20 and transmits light emitted from the light-emitting element 20 to the outside. In the upper surface of the light source 100, the upper surface of the light-transmissive member 30 is exposed from the covering member 50 to serve as the light-emitting portion of the light source. For example, the light-transmissive member 30 transmits 60% or more, preferably 70% or more, of light emitted from the light-emitting element 20 and/or light emitted from the light-emitting element 20 and subjected to wavelength conversion (such as light within the wavelength range of 320 nm to 850 nm). For example, such a member is made of an inorganic material such as glass, ceramic, or sapphire or an organic material such as a resin or a hybrid resin containing one or more of a silicone resin, a modified silicone resin, an epoxy resin, a modified epoxy resin, an acrylic resin, a phenolic resin, and a fluorocarbon resin.

The light-transmissive member 30 may contain a phosphor adapted to convert a wavelength of at least a portion of light incident on the light-transmissive member 30. Examples of the light-transmissive member 30 containing a phosphor include a mixture of the above-described material and phosphor powder, and a sintered body of a phosphor. For the light-transmissive member 30, a molded body made of resin, glass, or ceramic with a phosphor layer such as a resin layer containing a phosphor or a glass layer containing a phosphor on a surface of the molded body may be employed. The light-transmissive member 30 may contain a filler such as a diffusing material according to the purpose. When the light-transmissive member 30 contains a filler such as a diffusing material, the materials described above with the filled contained therein, or a molded body made of resin, glass, or ceramic and provided with a diffusing material layer, such as a resin layer containing a filler or a glass layer containing a filler, disposed on a surface of the molded body may be used for the light-transmissive member 30.

For the phosphor, a substance known in the art can be used. Examples of a phosphor adapted to emit green light include yttrium-aluminum-garnet based phosphors (such as $Y_3(Al,Ga)_5O_{12}$:Ce), lutetium-aluminum-garnet based phosphors (such as $Lu_3(Al,Ga)_5O_{12}$:Ce), terbium-aluminum-garnet based phosphors (such as $Tb_3(Al,Ga)_5O_{12}$:Ce), silicate based phosphors (such as $(Ba,Sr)_2SiO_4$:Eu), chlorosilicate based phosphors (such as $Ca_8Mg(SiO_4)_4Cl_2$:Eu), β-SiAlON based phosphors (such as $Si_{6-z}Al_zO_zN_{8-z}$:Eu (0<z<4.2)), and SGS based phosphors (such as $SrGa_2S_4$:Eu).

Examples of a phosphor that emits yellow light include α-SiAlON phosphors (such as $Mz(Si,Al)_{12}(O,N)_{16}$ (where 0<z≤2, and M is Li, Mg, Ca, Y, or a lanthanoid element except for La and Ce)). The phosphors adapted to emit green light described above also include phosphors adapted to emit yellow light. Also, yellow light can be obtained by, for example, substituting a portion of Y in an yttrium-aluminum-garnet phosphor with Gd to shift the peak emission wavelength to a longer wavelength. These phosphors include fluorescent substances adapted to emit orange light. Examples of a phosphor adapted to emit red light include nitrogen-containing calcium aluminosilicate (CASN or SCASN) based phosphors (such as (Sr,Ca)AlSiN$_3$:Eu) and BSESN based phosphors (such as $(Ba,Sr,Ca)_2Si_5N_8$:Eu). Examples of the phosphor adapted to emit red light also include manganese-activated fluoride phosphors (phosphors represented by a general formula (I) $A_2[M_{1-a}Mn_aF_6]$ (in the general formula (I), A is at least one selected from the group consisting of K, Li, Na, Rb, Cs, and NH$_4$, M is at least one element selected from the group consisting of the group IV elements and the group XIV elements, and "a" satisfies 0<a<0.2)). Examples of the manganese-activated fluoride phosphors include manganese-activated potassium fluorosilicate phosphors (such as $K_2SiF_6$:Mn), KSAF-based phosphors (for example, $K_2Si_{0.99}Al_{0.01}F_{5.99}$:MN), and MGF-based phosphors (for example, 3.5MgO, 0.5MgF$_2$, GeO$_2$: MN). The KSAF-based phosphor can have a composition represented by formula (I) shown below.

$$M_2[Si_pAl_qMN_rF_s] \quad (I)$$

In the formula (I), M represents an alkaline metal and may contain at least K. Mn may be a tetravalent Mn ion. p, q, r, and s may satisfy 0.9≤p+q+r≤1.1, 0<q≤0.1, 0<r≤0.2, and 5.9≤s≤6.1. p, q, r, and s preferably satisfy 0.95≤p+q+r≤1.05 or 0.97≤p+q+r≤1.03, 0<q≤0.03, 0.002≤q≤0.02, or 0.003≤q≤0.015, 0.005≤r≤0.15, 0.01≤r≤0.12, or 0.015≤r≤0.1, 5.92≤s≤6.05 or 5.95≤s≤6.025. For example, a composition represented by $K_2[Si_{0.946}Al_{0.005}Mn_{0.049}F_{5.995}]$, a composition represented by $K_2[Si_{0.942}Al_{0.008}Mn_{0.050}F_{5.992}]$, or a composition represented by $K_2[Si_{0.939}Al_{0.014}Mn_{0.047}F_{5.986}]$ can be employed. With such a KSAF-based phosphor, a red light emission having a high luminance and a narrow half width of the emission peak can be obtained.

For the diffusing material, a substance known in the art can be used. For example, barium titanate, titanium oxide, aluminum oxide, or silicon oxide can be used.

When a resin is used as a binder for the phosphor or the diffusing material, examples of the resin include the resin used for the light-transmissive member 30 described above.

Light-Guiding Member

The light source may include a light-guiding member 40 between the light-transmissive member 30 and the light-emitting element 20.

For example, the light-guiding member 40 bonds the light-emitting element 20 to the plate-shaped or sheet-shaped light-transmissive member 30. The light-guiding member 40 is configured to guide light from the light-emitting element 20 to the light-transmissive member 30. Accordingly, a light-transmissive material is preferably used for the light-guiding member 40. The light-guiding member 40 may also be located on the lateral surfaces of the light-emitting element 20.

For the light-guiding member 40, for example, a light-transmissive resin can be used. Examples of the light-transmissive resin include resins described above as examples of a material to be used for the light-transmissive member 30, and the like. The light-guiding member 40 may contain the phosphor and/or the diffusing material described above.

Covering Member

The covering member 50 covers the lateral surfaces of the light-transmissive member 30 such that the upper surface of the light-transmissive member 30 is exposed. The covering member 50 is disposed on the flat plate-shaped substrate 10 and covers the lateral surfaces of the light-emitting element 20 and the lateral surfaces of the light-transmissive member 30. In the case in which the lateral surfaces of the light-emitting element 20 are covered with the light-guiding member 40 and the light-transmissive member 30, the covering member covers the lateral surfaces of the light-emitting element 20 with the light-guiding member 40 and the light-transmissive member 30 located therebetween.

For the covering member 50, for example, a resin can be used. Examples of the resin used for the covering member 50 include the resin used for the light-transmissive member 30 described above.

The covering member 50 may contain a filler such as a light-reflective substance in the resin described above. This allows the covering member 50 to serve as a light-reflective member for reflecting light emitted from the light-emitting element and efficiently emitting the light upward.

Examples of the light-reflective substance include titanium oxide, silicon oxide, aluminum oxide, zirconium oxide, magnesium oxide, potassium titanate, zinc oxide, silicon nitride, and boron nitride. Among these materials, titanium oxide, which has a relatively high refractive index, is preferably used in view of reflection of light. For example, the proportion of the light-reflective substance can be 20 wt % to 80 wt % or less relative to the weight of the resin.

The covering member can be formed integrally with the substrate. For example, when using a substrate defining a recess in the upper surface of the substrate, the recess accommodating the light-emitting element 20, the covering member may be a lateral wall defining the recess and formed integrally with the base material.

A portion of the covering member 50 covering the lateral surfaces of the light-transmissive member 30 preferably has a width in an array direction of the light sources (that is, the distance between a lateral surface of the light-transmissive member 30 and an outer lateral surface of the light source) of 30 μm or greater and 300 μm or less, more preferably 50 μm or greater and 200 μm or less, in view of inhibition of leakage of light in a lateral direction and miniaturization of the light source.

Bonding Member

The bonding members 60 bond a plurality of light sources 100. The bonding members 60 are disposed between lateral surfaces of adjacent light sources 100 facing each other. Each of the bonding members 60 bonds corresponding lateral surfaces 103 of adjacent light sources 100 such that the upper surfaces 101 and the lower surfaces 102 of the light sources 100 are exposed and such that the bonding members 60 are spaced apart from the external connection terminals 3. That is, in the light-emitting device 200, lateral surfaces of adjacent ones of a plurality of light sources 100 are bonded with the bonding members disposed therebetween such that the upper surfaces of light sources 100 with the light-emitting portions and the lower surfaces of light sources 100 with the external connection terminals of the light sources are exposed from the bonding members.

The bonding members 60 are disposed between adjacent light sources. In order to reduce interference of light between adjacent light sources, a member having a light transmittance lower than the light transmittance of the covering member 50 is preferably used for the bonding member 60. In this case, the bonding member 60 more preferably covers substantially the entirety of lateral surfaces facing each other in adjacent light sources.

For the bonding member 60, for example, a resin containing a light-shielding filler can be used. Examples of the resin include resins described above as examples of the resin to be used for the light-transmissive member 30. Examples of the light-shielding filler include fillers such as light-absorbing substances and light-reflective substances. Examples of the light-reflective substance include light-reflective substances described above as examples of the light-reflective substance to be used for the covering member 50. Examples of the light-absorbing substance include black pigments such as carbon black and graphite. A pigment or a dye of a color other than black may also be added. For example, a gray resin in which black and white pigments have been added may be used. Among these materials, a black resin or a gray resin is preferably used. When the bonding member 60 made of a black resin or a gray resin is disposed between the light sources 100, interference of light from a light source 100 with an adjacent light source 100 can be reduced. This structure allows for obtaining a light-emitting device with good "visibility," which refers to good contrast between a light-emitting region and a non-light-emitting region when the light sources are individually turned on.

The bonding member 60 is preferably disposed between the light sources such that the upper surface of the bonding member 60 is in the same plane with the upper surface of the light source, considering creeping up of the bonding member 60 onto the upper surface of the light source. The upper surface of the bonding member 60 may be slightly recessed considering thermal expansion of the bonding member 60.

The bonding member 60 is preferably disposed between the light sources such that the lower surface of the bonding member is in the same plane with the lower surface of the light source, considering creeping up of the bonding member onto the external connection terminals. The lower surface of the bonding member 60 may be slightly recessed considering thermal expansion of the resin.

The recessed surface can be formed using a sink mark due to curing of the resin (shrinkage of the resin).

A portion of the bonding member 60 between the light sources preferably has width (that is, the distance between adjacent light sources) of 1 μm or greater and 200 μm or less, greater preferably 5 μm or greater and 50 μm or less, in view of reduction of interference of light among the light sources, reduction of dark lines between the light sources when the adjacent light sources are turned on at the same time, and ease of mixing of emission colors when light sources having different emission colors are combined.

The light source 100 can include a light-emitting portion having a desired emission color by adjusting the emission wavelength of the light-emitting element and the combination and blending ratio of wavelength conversion members contained in the light-transmissive member. An example of a red light source is a light source including a blue light-emitting element 20 and a light-transmissive member 30 containing a red phosphor. An example of a white light-emitting portion is a light-emitting portion including a blue light-emitting element 20 and a light-transmissive member 30 containing a yellow phosphor. An example of a green light-emitting portion is a light-emitting portion including a green light-emitting element 20 and a light-transmissive member 30 containing a diffusing material. An example of a green light-emitting portion is a light-emitting portion including a blue light-emitting element 20 and a light-transmissive member 30 containing a green phosphor. An example of a blue light-emitting portion is a light-emitting portion including a blue light-emitting element 20 and a light-transmissive member 30 containing a diffusing material.

As described below, light sources in a desired rank are extracted from light sources ranked in terms of at least one of luminous flux and chromaticity and combined, which constitutes the light sources 100 of the light-emitting device 200.

For example, the light sources 100 of the light-emitting device 200 are a combination of a plurality of light sources 100 extracted from a group of light sources having the same emission color, such as light sources in the same chromaticity rank. This can reduce unevenness in emission color of the light-emitting device 200.

In this case, light sources in the same chromaticity rank and different luminous flux ranks may be combined. For example, a light source 100 at a center of the light emitting device 200 can be in a higher luminous flux rank than light sources 100 disposed at peripheral sides of the light emitting device 200. As shown in FIG. 1F, for example, the single light source 100 disposed at the center is preferably in a higher rank than the light sources 100 disposed at the peripheral sides, and the light sources disposed at the peripheral sides are preferably in an equal luminous flux rank. For example, the luminous flux of the light source disposed at the center is 400 to 425 lumens, and the luminous flux of the light sources disposed at the peripheral sides is 375 to 400 lumens. Such light-emitting characteristics allow for illuminating more brightly the central region of an irradiation region when using for a vehicle lamp such as a headlight, which is preferable. The luminous flux rank of light sources to be extracted can be selected considering the optical characteristics of a lens to be combined with the light-emitting device.

Method of Manufacturing Light-Emitting Device

A method of manufacturing the light-emitting device will be described.

Figure 2:
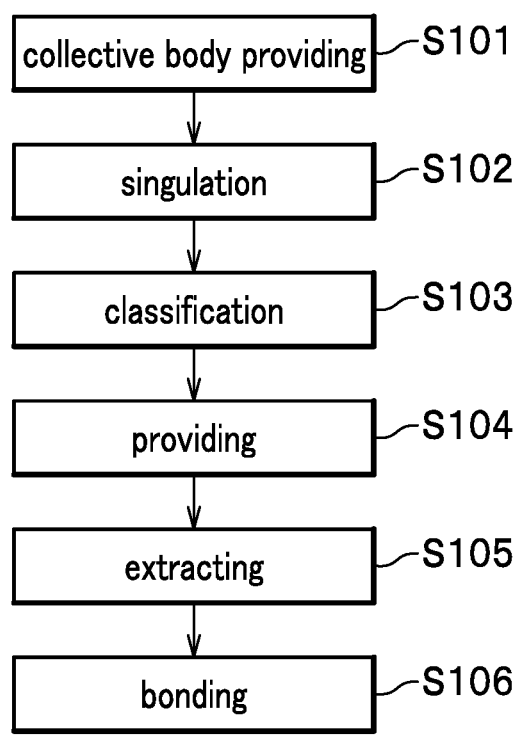
FIG. 2 is a flowchart of a method of manufacturing the light-emitting device according to the first embodiment.
Figure 3A:
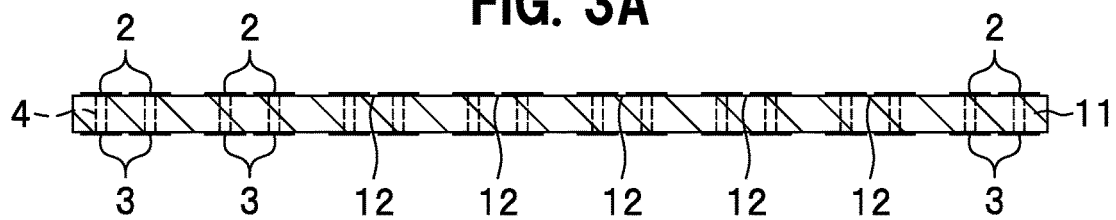
FIG. 3A is a schematic cross-sectional view illustrating the method of manufacturing the light-emitting device according to the first embodiment.
Figure 3B:
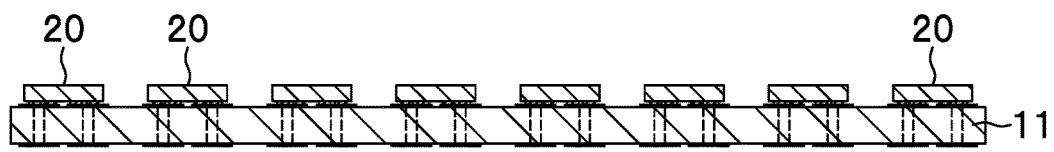
FIG. 3B is a schematic cross-sectional view illustrating the method of manufacturing the light-emitting device according to the first embodiment.
Figure 3C:
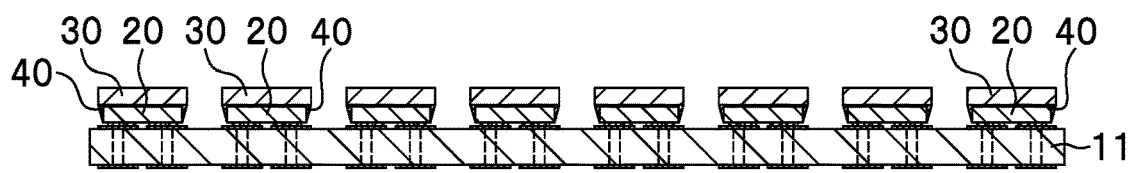
FIG. 3C is a schematic cross-sectional view illustrating the method of manufacturing the light-emitting device according to the first embodiment.
Figure 3D:
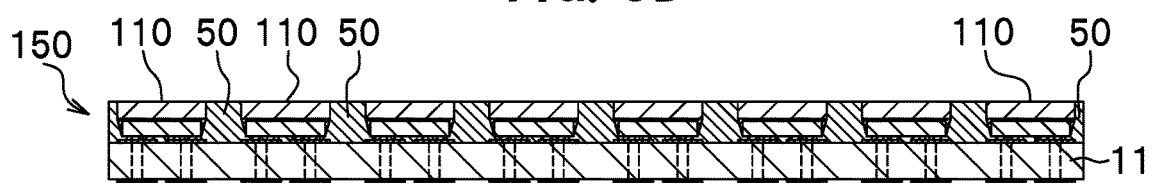
FIG. 3D is a schematic cross-sectional view illustrating the method of manufacturing the light-emitting device according to the first embodiment.
Figure 3E:
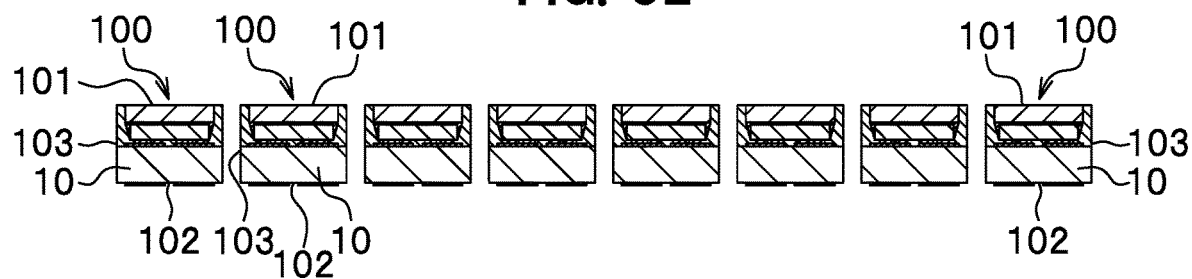
FIG. 3E is a schematic cross-sectional view illustrating the method of manufacturing the light-emitting device according to the first embodiment.
Figure 3F:
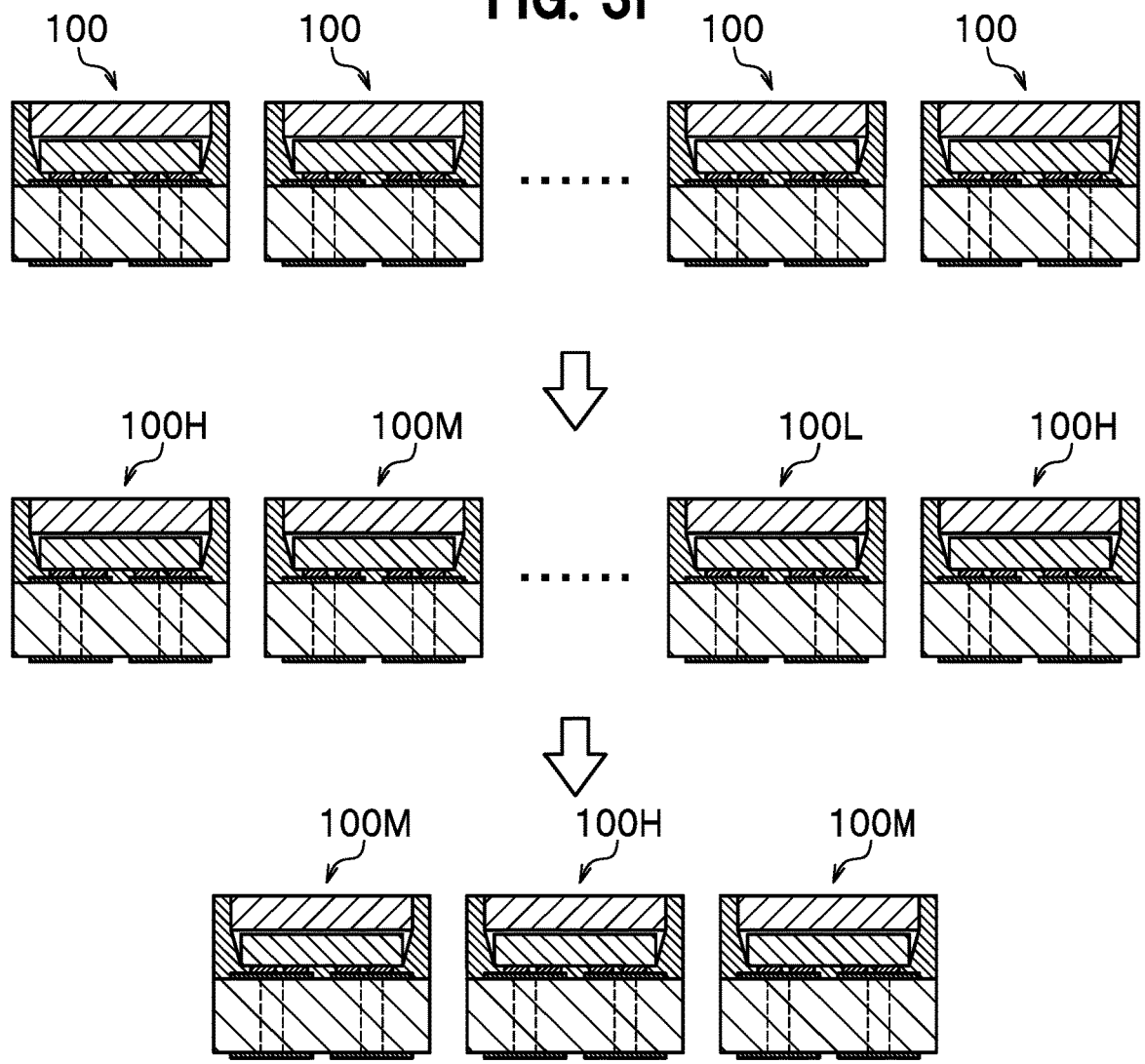
FIG. 3F is a schematic cross-sectional view illustrating the method of manufacturing the light-emitting device according to the first embodiment.
Figure 3G:
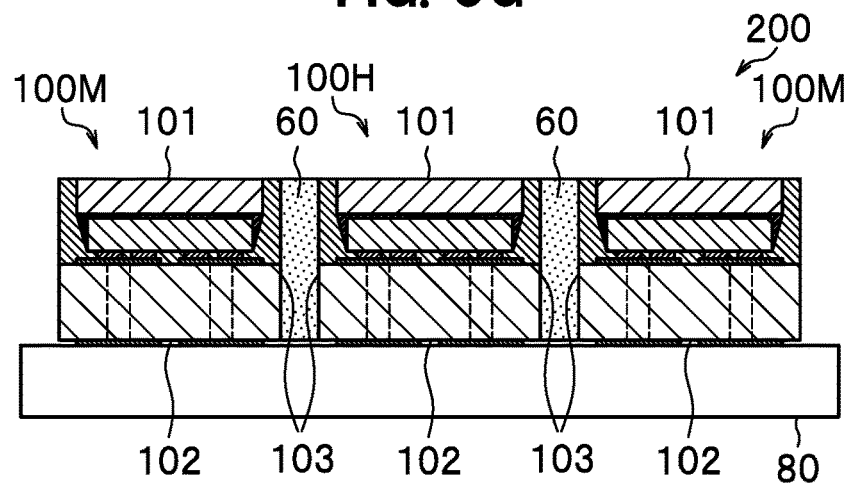
FIG. 3G is a schematic cross-sectional view illustrating the method of manufacturing the light-emitting device according to the first embodiment.

FIG. 2 is a flowchart of the method of manufacturing the light-emitting device according to the first embodiment. FIG. 3A to FIG. 3G are schematic cross-sectional views illustrating the method of manufacturing the light-emitting device according to the first embodiment.

The method of manufacturing the light-emitting device 200 includes a providing step S104, an extracting step S105, and a bonding step S106. In the providing step S104, a plurality of light sources 100 are provided. Each of the light sources 100 has the upper surface 101 including the light-emitting portion 110, the lower surface 102 opposite to the upper surface 101, and the lateral surfaces 103 between the upper surface 101 and the lower surface 102 and is ranked in terms of at least one of luminous flux and chromaticity. In the extracting step S105, a plurality of light sources 100 in a desired rank are extracted from the light sources 100. In the bonding step S106, the lateral surfaces 103 of the extracted light sources 100 are bonded via the bonding members 60 such that the upper surfaces 101 and the lower surfaces 102 of the light sources 100 are exposed from the bonding members 60.

The method of manufacturing the light-emitting device 200 may also include, before the providing step S104, a collective body providing step S101, a singulation step S102, and a classification step S103. In the collective body providing step S101, a collective body 150 of light sources including a plurality of light-emitting portions 110 in the upper surface is provided. In the singulation step S102, the collective body 150 is divided between adjacent ones of the light-emitting portions 110 into a plurality of light sources 100. In the classification step S103, luminous flux and chromaticity of the light sources 100 after the singulation step S102 are measured, and the light sources 100 are ranked on the basis of the at least one of luminous flux and chromaticity measured.

The materials, arrangement, and the like of members are as described for the light-emitting device 200 described above, and detailed description thereof may be omitted when appropriate.

Collective Body Providing Step

In the collective body providing step S101, the collective body 150 including a plurality of light-emitting portions 110 on the upper surface is provided as the collective body 150 of light sources. The collective body 150 includes a collective substrate 11 that is a collective body of substrates 10 of light sources 100, a plurality of light-emitting elements 20 disposed on the collective substrate 11, light-transmissive members each covering a respective one of the light-emitting elements, and a covering member covering lateral surfaces of the light-transmissive members such that the upper surfaces of the light-transmissive members are exposed.

Figure 4A:
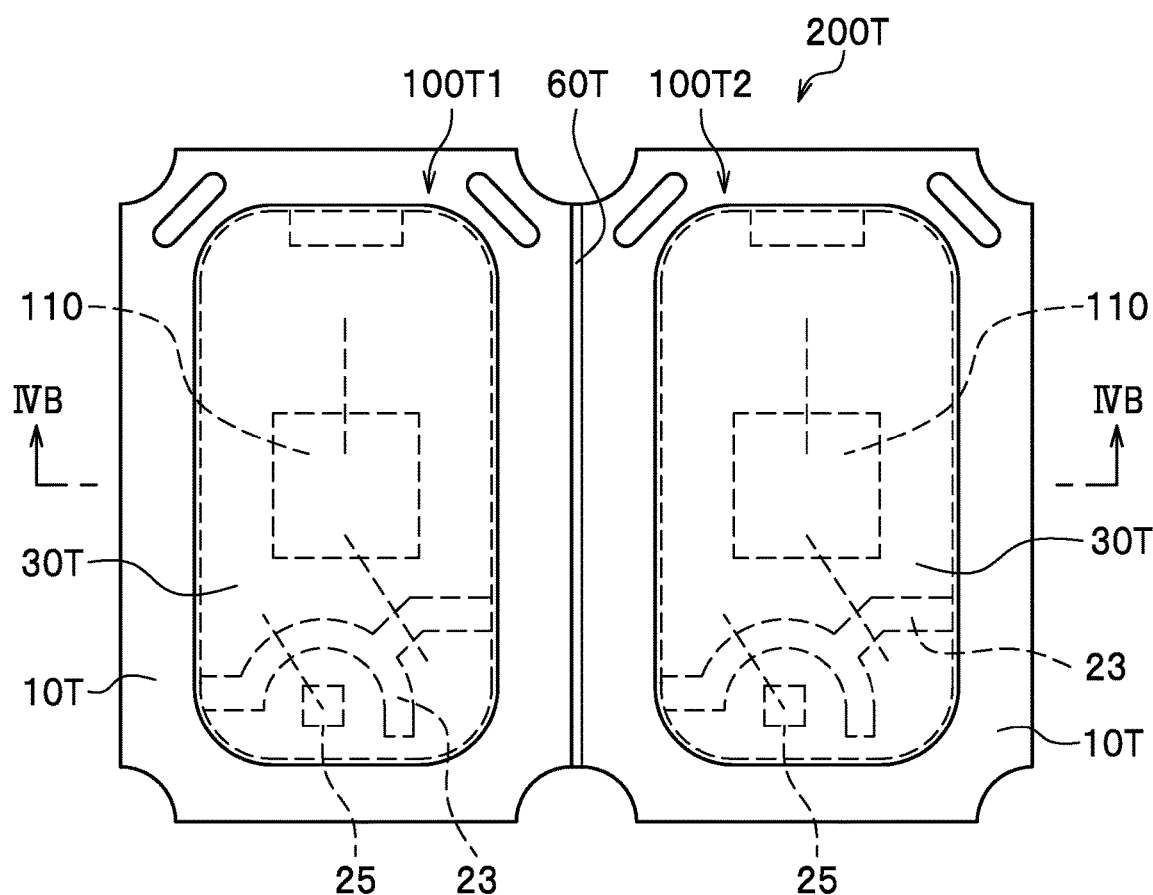
FIG. 4A is a schematic plan view of a light-emitting device according to a second embodiment.

In the step S101, the collective substrate 11 is provided including a plurality of disposition regions 12 on the upper surface in which the light-emitting elements 20 are to be disposed. At least one light-emitting element 20 is disposed in each of the disposition regions 12. The collective substrate 11 includes wirings on each of the upper surface and the lower surface opposite to the upper surface. A protective element 25 may be disposed in each of the disposition regions 12. FIG. 4A schematically shows a collective substrate 11 including eight disposition regions 12 aligned in a lateral direction for convenience, but the number of disposition regions 12 can be appropriately adjusted.

Subsequently, the light-transmissive members 30 are disposed to cover respective light-emitting elements 20 each disposed in a respective one of the disposition regions 12. For example, the light-transmissive member 30 can be formed by potting, printing, or spraying. Alternatively, the light-transmissive members 30 that have been formed into plates or sheets may be provided and disposed on the light-emitting elements 20. In this example, plate-shaped light-transmissive members 30 are disposed on the light-emitting elements 20 provided with light-guiding members on the upper surfaces of the light-emitting elements 20, and each of the light-emitting elements 20 and a respective one of the light-transmissive members 30 are bonded together with a respective one of the light-guiding members 40 disposed therebetween.

Subsequently, a resin containing a light-reflective member is disposed on the collective substrate 11 as the covering members 50 covering the lateral surfaces of the light-transmissive members 30. The resin is disposed on the collective substrate 11 such that the upper surfaces of the light-transmissive members 30 are exposed from the resin. That is, the upper surfaces of the light-transmissive members 30 are exposed from the covering members 50, and serve as the light-emitting portions. The collective body 150 of light sources including a plurality of light-emitting portions 110 on the upper surface can thus be formed. The covering members 50 cover the lateral surfaces of the light-emitting elements 20, the lateral surfaces of the light-guiding members 40, the lateral surfaces of the light-transmissive members 30 and the upper surface of the collective substrate 11. The covering members 50 may be disposed in the gaps between the light-emitting elements 20 and the collective substrate 11 to serve as underfill. For example, the covering members 50 can be formed by transfer molding, injection molding, compression molding, potting, printing, or spraying. Alternatively, a collective substrate defining a plurality of recesses in the upper surface thereof may be provided as the collective substrate 11, one or more light-emitting elements may be disposed at the bottom of each recess, and the light-transmissive member 30 covering the light-emitting element may be disposed in each of the plurality of recesses.

Singulation Step

In the singulation step S102, the collective body 150 of light sources is divided between adjacent ones of the light-emitting portions 110 into a plurality of light sources 100. In the singulation step S102, the covering member 50 and the collective substrate 11 are divided in the thickness direction between adjacent light-emitting portions. For example, the division can be performed by cutting with a blade. This allows for obtaining a plurality of light sources 100 each having the upper surface 101 including the light-emitting portion 110, the lower surface 102 opposite to the upper surface 101, and the lateral surfaces 103 between the upper surface 101 and the lower surface 102.

Classification Step

In the classification step S103, the luminous flux and/or chromaticity of each light source 100 after the singulation step S102 is measured, and each light source 100 is ranked on the basis of the measured value. Alternatively, light sources provided by purchasing or the like may be ranked in the classification step S103.

Classification in terms of luminous flux can be performed on the basis of measured luminous fluxes (in units of lumens) into three ranks such as a high luminous flux rank assigned to light sources 100H, a middle luminous flux rank assigned to light sources 100M, and a low luminous flux rank assigned to light sources 100L. The classification may be performed into two ranks or four or more ranks according to desired optical characteristics of the light-emitting device 200 and the arrangement of the light sources 100.

Classification in terms of chromaticity can be performed on the basis of any appropriate chromaticity ranges (such as a range defined by a quadrangle connecting four chromaticity coordinates) set on the basis of XY chromaticity coordinates of the CIE 1931 chromaticity diagram.

Providing Step

In the providing step S104, a plurality of light sources each of which has an upper surface including a light-emitting portion, a lower surface opposite to the upper surface, and lateral surfaces between the upper surface and the lower surface and is ranked in terms of at least one of luminous flux and chromaticity are provided. The light sources may be provided by purchasing light sources ranked in terms of at least one of luminous flux and chromaticity, or the light sources 100 ranked in the classification step S103 may be provided. For example, in the providing step S104, white light sources in the same chromaticity class (rank) are provided that include the light sources 100H in a high luminous flux rank, the light sources 100L in a lower luminous flux rank than the light source 100H, and the light sources 100M in a rank between the rank of the light sources 100H and the rank of the light sources 100L.

Extracting Step

In the extracting step S105, a plurality of light sources 100 in a desired rank are extracted from the light sources 100 provided in the step S104. Light sources in an appropriate rank are extracted such that the light-emitting device 200 has desired optical properties. For example, when producing a light-emitting device 200 in which a plurality of white light sources 100 are arranged, two ranks of light sources 100 are selected; that is, a light source 100H in the high luminous flux rank and light sources 100M in the middle luminous flux rank are extracted. The extracted light sources 100 in two ranks are arranged in a lateral direction such that the light source 100H in the high luminous flux rank is located between the light sources 100M in the middle luminous flux rank.

In the example shown in FIG. 1F, the light sources 100 are arranged in one row and three columns, in which the light source in the high luminous flux rank is disposed at the center. Alternatively, a plurality of light sources 100 may be arranged in a matrix other than the one-by-three matrix.

Bonding Step

In the bonding step S106, the lateral surfaces 103 are bonded together with the bonding members 60 disposed therebetween such that the upper surfaces 101 and the lower surfaces 102 of the light sources 100 extracted and arranged are exposed from the bonding members 60.

In the bonding step S106, the light sources 100 extracted in the extracting step S105 are disposed on a supporting member, and uncured bonding materials are disposed between the light sources 100 by, for example, potting or spraying, and are cured to form the bonding members 60. The bonding members 60 bond corresponding lateral surfaces of the light sources 100, such as cut surfaces formed in the singulation step S102. Bonding the cut surfaces, which tend to be rough, allows for improving adhesion to the bonding members. The bonding members 60 are spaced apart from the external connection terminals 3 so as not to cover the external connection terminals 3 on the lower surfaces of the light sources 100. In the bonding step S106, the external connection terminals 3 may be covered with the bonding members 60, and excessive portions of the bonding members 60 covering the external connection terminals 3 may be removed.

Examples of the supporting member include sheet members constituted of heat-resistant resin sheets or UV-curable sheets. When a resin sheet is used for the supporting member, the bonding step S106 may include a step of removing the sheet member from the lower surfaces of the light sources 100 bonded together with the bonding members 60.

In the case in which the collective substrate is cut with, for example, a blade in the singulation step described above, a width (that is, the distance between the lateral surfaces of adjacent light sources 100 facing each other) of the bonding member disposed between lateral surfaces of adjacent ones of the light sources 100 facing each other can be smaller than a cut width of the blade, so that the light sources 100 can be disposed more closely to each other. This allows for miniaturizing the light-emitting device to be obtained.

Second Embodiment

Figure 4B:
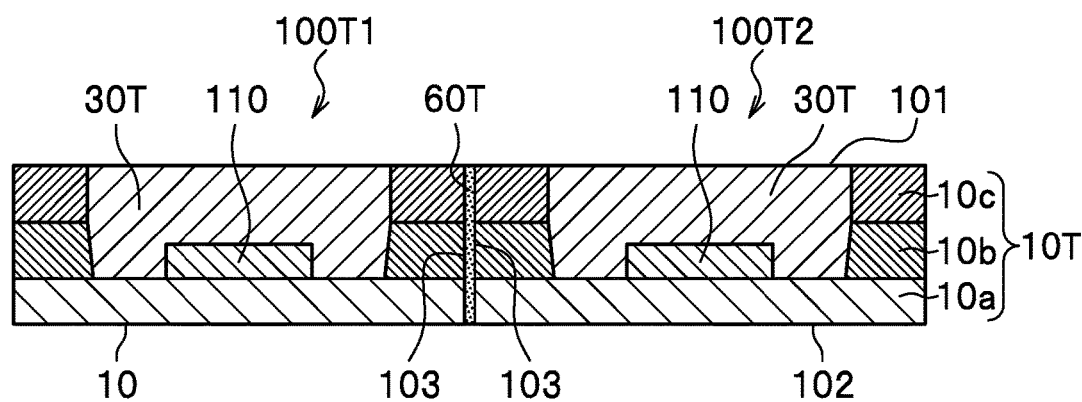
FIG. 4B is a schematic cross-sectional view taken along line IVB-IVB of FIG. 4A.

Next, a light-emitting device according to a second embodiment will be described with reference to FIG. 4A, FIG. 4B, FIG. 5, FIG. 6A, and FIG. 6B. FIG. 4A is a schematic plan view of the light-emitting device according to the second embodiment, and FIG. 4B is a schematic cross-sectional view taken along line IVB-IVB of FIG. 4A.

A light-emitting device 200T includes a plurality of light sources 100T1 and 100T2 (two in this case) and a bonding member 60T bonding the light sources 100T1 and 100T2. Each of the light sources 100T1 and 100T2 has the upper surface 101 including the light-emitting portion 110, the lower surface 102 opposite to the upper surface 101, and the lateral surfaces 103 between the upper surface 101 and the lower surface 102. For example, the light sources 100T1 and 100T2 have a substantially rectangular parallelepiped shape with four corners curved inward in a plan view. The lateral surfaces 103 of the light sources 100T1 and 100T2 are bonded with the bonding member 60T disposed therebetween such that the upper surfaces 101 and the lower surfaces 102 of the light sources are exposed from the bonding member 60T to constitute the single light-emitting device 200T. In this example, in the light-emitting device 200T, the lateral surfaces 103, facing each other, of two adjacent light sources 100T1 and 100T2 having different emission colors are bonded together such that the light-emitting portions 110 are aligned in a single direction.

By combining light sources having different emission colors, a multicolor light-emitting device 200T can be obtained. The light-emitting device 200T can be manufactured by providing a plurality of light sources having emission colors in different chromaticity ranks in the providing step, extracting a plurality of light sources in chromaticity ranks of a desired emission color in the extracting step, and bonding lateral surfaces of the extracted light sources. In this case, the light sources having different emission colors preferably have substantially the same outer shape.

Each of the light sources 100T1 and 100T2 has a substrate 10T defining a recess in the upper surface of the substrate 10T. The light-emitting element 20 and the protective element 25 are disposed in the recess. For example, a ceramic substrate is used for the substrate 10T is. For the substrate 10T defining the recess, a known substrate such as a ceramic substrate and a resin package can be used.

Each of the light-emitting element 20 and the protective element 25 is electrically connected to wirings on the substrate 10T via electroconductive members such as wires.

A light-transmissive member 30T covers the light-emitting element 20 and the protective element 25 and transmits light emitted from the light-emitting element 20 to emit the light to the outside. The light-transmissive member 30T serves as the light-emitting portion of each of the light sources 100T1 and 100T2. For the light-transmissive member 30T, a material similar to a material of the light-transmissive member 30 described above. The light-transmissive member 30T can contain a phosphor adapted to convert wavelengths of at least a portion of light incident on the light-transmissive member 30T.

Figure 5:
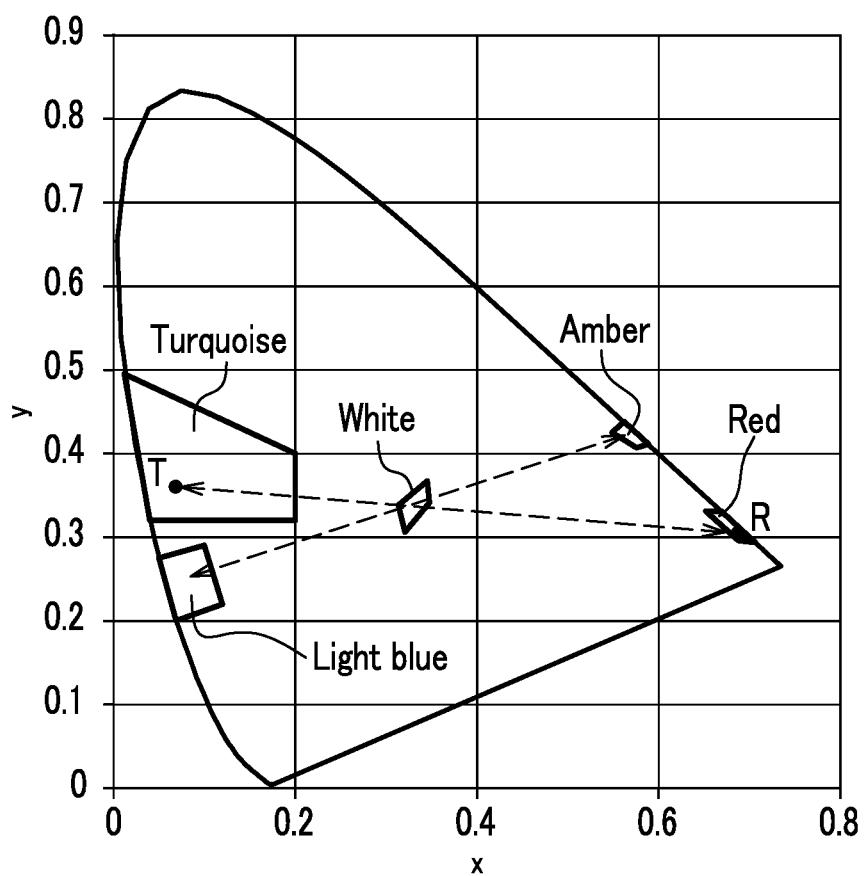
FIG. 5 is the 1931 CIE chromaticity diagram illustrating the chromaticity of the light-emitting device according to the second embodiment.

The light-emitting device 200T includes the two light sources 100T1 and 100T2 having different chromaticities. The light source 100T1 of the light-emitting device 200T is configured to emit red light. More specifically, as shown in FIG. 5, the light source 100T1 is configured to emit light in a chromaticity range Red defined by a first straight line connecting a first point and a second point, a second straight line connecting the second point and a third point, a third straight line connecting the third point and a fourth point, and a curved line of the chromaticity diagram connecting the fourth point and the first point in the CIE 1931 chromaticity diagram, where the first point has chromaticity coordinates (x, y) of (0.669, 0.331), the second point has coordinates (0.652, 0.331), the third point has coordinates (0.688, 0.296), and the fourth point has coordinates (0.707, 0.294). The light source 100T1 can emit red light by using a blue light-emitting element as the light-emitting element 20 and employing the combination of the blue light-emitting element and a phosphor excited by blue light emitted from the light-emitting element to emit red light.

The light source 100T2 of the light-emitting device 200T is configured to emit blue-green (turquoise) light. More specifically, as shown in FIG. 5, the light source 100T2 is configured to emit light in a chromaticity range Turquoise defined by a first straight line connecting a first point and a second point, a second straight line connecting the second point and a third point, a third straight line connecting the third point and a fourth point, and a curved line of the chromaticity diagram connecting the fourth point and the first point in the CIE 1931 chromaticity diagram, where the first point has chromaticity coordinates (x, y) of (0.012, 0.495), the second point has coordinates (0.200, 0.400), the third point has coordinates (0.200, 0.320), and the fourth point has coordinates (0.040, 0.320). For example, the light source 100T2 can emit blue-green light by using blue-green light-emitting element as the light-emitting element 20. In order to adjust the chromaticity, a phosphor adapted to be excited by light emitted from the light-emitting element 20 and has a peak emission wavelength within the green, yellow-green, yellow, orange, or red wavelength range may be used in combination with the light source 100T2.

The bonding member 60T is disposed between lateral surfaces of the adjacent light sources 100T1 and 100T2 facing each other and bonds the lateral surfaces 103 of the adjacent light sources 100T1 and 100T2 such that the upper surface 101 and the lower surface 102 of each of the light sources 100T1 and 100T2 are exposed. For the bonding member 60T used in this example, a member similar to the bonding member 60 described above can be used. In the case in which a light-transmissive member 30T contains a phosphor, the bonding member 60T is preferably made of a light-shielding resin. Examples of the light-shielding resin include a black or gray resin containing a black pigment. With such a material, light leaking out from one light source and exciting a phosphor of the other adjacent light source. Accordingly, a light-emitting device with good "visibility," which refers to good contrast between a light-emitting region and a non-light-emitting region, can be obtained.

Figure 6A:
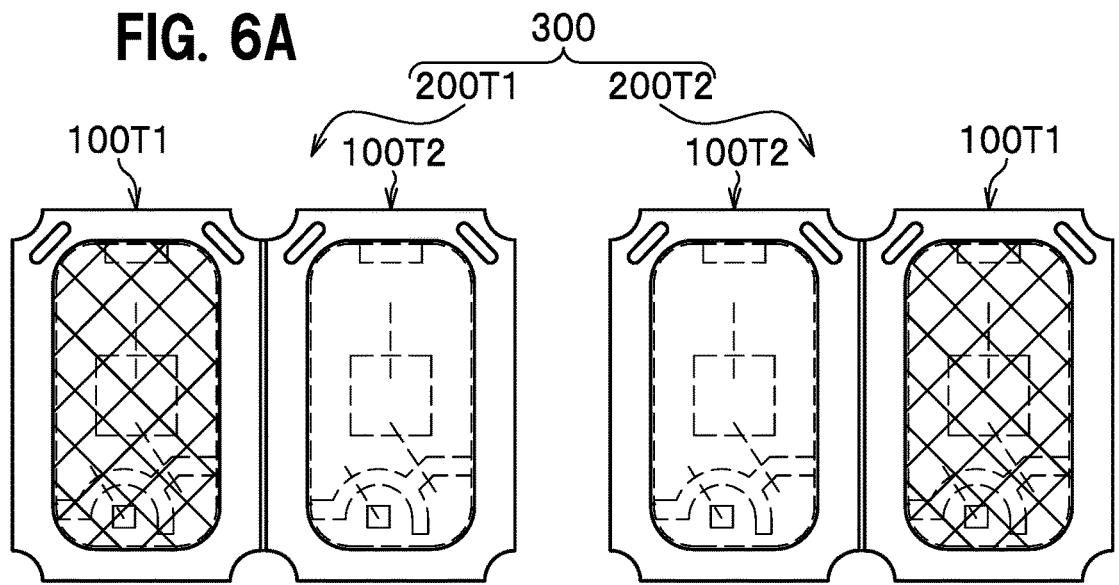
FIG. 6A schematically shows a light-emission state of the light-emitting device according to the second embodiment.
Figure 6B:
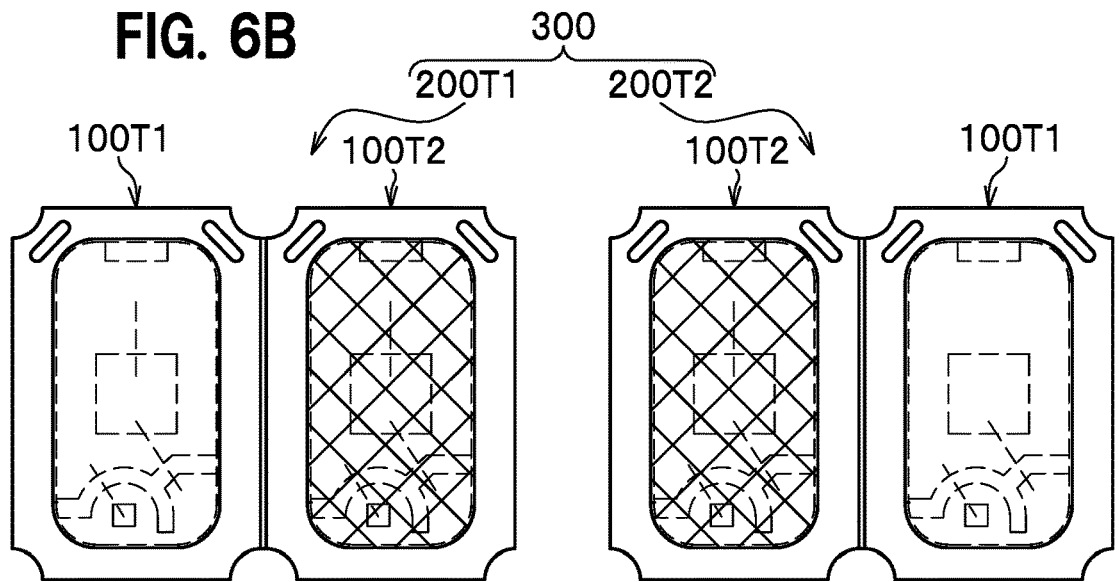
FIG. 6B schematically shows a light-emission state of the light-emitting device according to the second embodiment.
Figure 6C:
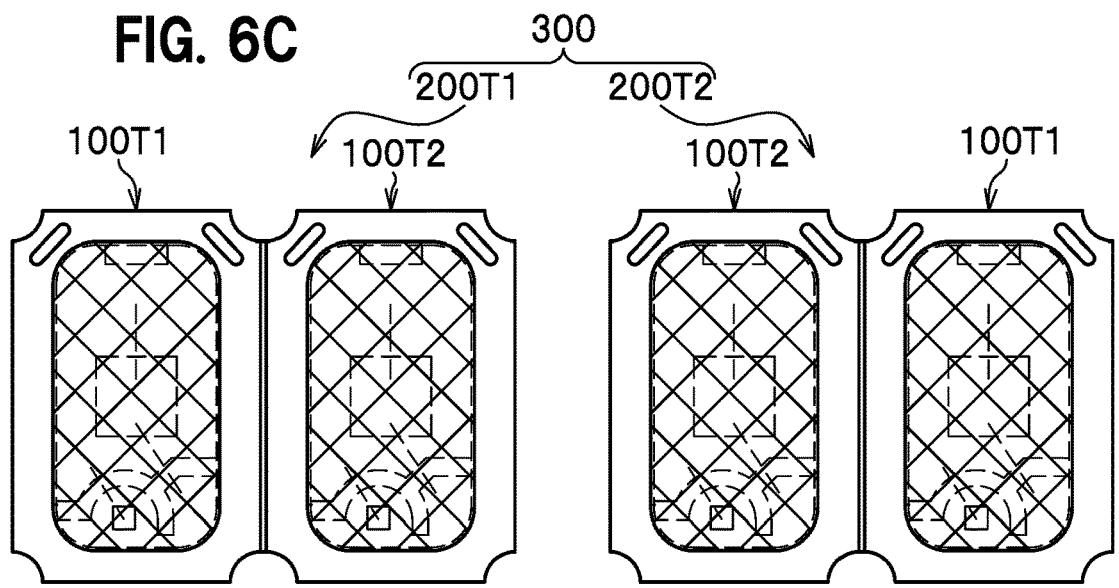
FIG. 6C schematically shows a light-emission state of the light-emitting device according to the second embodiment.

The light-emitting device 200T having such a structure will be described with reference to FIG. 5 and FIG. 6A to FIG. 6C. In FIG. 6A to FIG. 6C, light sources indicated by hatching with a netlike pattern are being left turned on.

For example, FIG. 6A to FIG. 6C schematically show a light-emitting unit 300 including a combination of two light-emitting devices 200T, each shown in FIG. 4A and FIG. 4B, as a first light-emitting device 200T1 and a second light-emitting device 200T2. For example, this light-emitting unit 300 can be used for a vehicle lamp for a car or a railway carriage. In this case, the light-emitting unit 300 preferably has a structure in which the light-emitting devices 200T, each shown in FIG. 4A and FIG. 4B, are point-symmetrically arranged at right and left sides to serve as the first light-emitting device 200T1 and the second light-emitting device 200T2.

The light-emitting unit 300 emits red light when the first light source 100T1 of each of the first light-emitting device 200T1 and the second light-emitting device 200T2 is turned on. The light-emitting unit 300 emits blue-green light when the second light source 100T2 of each of the first light-emitting device 200T1 and the second light-emitting device 200T2 is turned on. The light-emitting unit 300 can emit white light having a mixed color constituted of red light and blue-green light when the first light sources 100T1 and the second light sources 100T2 of the first light-emitting device 200T1 and the second light-emitting device 200T2 are turned on at the same time.

For example, chromaticity ranks of light sources to be extracted as the first light source and the second light source are determined such that a straight line passing through a chromaticity point R of the first light source that emits light in the chromaticity range "Red" and a chromaticity point T of the second light source that emits light in the chromaticity range "Turquoise" passes through a chromaticity range "White" of white light in the XY chromaticity diagram as shown in FIG. 5. For example, the chromaticity range "White" of white light is a range defined by a first straight line connecting a first point and a second point, a second straight line connecting the second point and a third point, a third straight line connecting the third point and a fourth point, and a fourth straight line connecting the fourth point and the first point, where the first point has chromaticity coordinates (x, y) of (0.321, 0.306), the second point has coordinates (0.314, 0.338), the third point has coordinates (0.346, 0.367), and the fourth point has coordinates (0.348, 0.341).

When the light-emitting unit 300 is used for a vehicle lamp, for example, blue-green light can serve as an automated driving indicator lamp indicating to those around the vehicle that the vehicle is in the automatic driving mode, red light can serve as a taillight, and white light can serve as a backup light (reversing light).

Light-emitting devices employing another combination of colors of light sources may be used for the light-emitting unit. For example, the first light source is configured to emit light having an emission color of orange (amber). More specifically, as shown in FIG. 5, the first light source can be configured to emit light in a chromaticity range "Amber" defined by a first straight line connecting a first point and a second point, a second straight line connecting the second point and a third point, a third straight line connecting the third point and a fourth point, and a curved line of the chromaticity diagram connecting the fourth point and the first point in the CIE 1931 chromaticity diagram, where the first point has chromaticity coordinates (x, y) of (0.562, 0.438), the second point has coordinates (0.549, 0.425), the third point has coordinates (0.576, 0.407), and the fourth point has coordinates (0.589, 0.411). The second light source is configured to emit light having an emission color of light-blue.

More specifically, as shown in FIG. 5, the second light source is configured to emit light in a chromaticity range "Light blue" defined by a first straight line connecting a first point and a second point, a second straight line connecting the second point and a third point, a third straight line connecting the third point and a fourth point, and a curved line of the chromaticity diagram connecting the fourth point and the first point, where the first point has chromaticity coordinates (x, y) of (0.050, 0.275), the second point has coordinates (0.100, 0.290), the third point has coordinates (0.120, 0.220), and the fourth point has coordinates (0.069, 0.200). In this case, when the first light sources of the first light-emitting device and the second light-emitting device are turned on, the light-emitting unit emits orange light. When the second light sources of the first light-emitting device and the second light-emitting device are turned on, the light-emitting unit emits light-blue light. When the first light sources and the second light sources of the first light-emitting device and the second light-emitting device are turned on at the same time, the light-emitting unit can emit white light having a mixed color constituted of orange and light-blue.

For example, light-blue light can serve as a lamp that indicates the state of charge of a vehicle, orange light can serve as a turn signal, and white light can serve as a daytime running lamp (DRL).

As described above, in the light-emitting unit, light sources in such chromaticity ranks that a straight line passing through the chromaticity coordinates of two light sources in each light-emitting device passes through the white chromaticity range in the chromaticity diagram can be used in combination. This structure allows white light and colored light having two colors to be emitted through a single lens of the light-emitting unit, which allows for saving space and improving design qualities.

In the light-emitting device including a plurality of light sources arranged with bonding members disposed therebetween, influences of turning on and off of adjacent light sources can be reduced, so that brightness and darkness of the individual light sources are clearly observed.

In the case described above in which a plurality of light sources are used in the light-emitting device, two, three, or four or more light sources are aligned in a straight direction, and adjacent light sources are bonded with bonding members disposed therebetween, but other appropriate arrangement may be employed. For example, light sources may be arranged in two rows and two columns. In particular, when the light sources include light-emitting elements in different luminous flux ranks that can be individually turned on and off, color variations can be increased.

A method of manufacturing the light-emitting unit is substantially the same as the method of manufacturing the light-emitting device of the first embodiment except that a plurality of light-emitting device collective bodies and light-emitting devices of the same or different emission colors are used, and the description is omitted.

While certain embodiments of the present invention have been described above, the present invention is not limited the description above, and should be broadly construed on the basis of the claims. The present invention also encompasses variations and modifications that are made on the basis of the description above.

What is claimed is:

1. A method of manufacturing a light-emitting device, the method comprising:
a providing step comprising providing a plurality of light sources, each of the light sources having an upper surface including a light-emitting portion, a lower surface opposite to the upper surface, and lateral surfaces between the upper surface and the lower surface, wherein:
each of the light sources comprises:
a light-emitting element,
a light-transmissive member covering an upper surface of the light-emitting element and containing a phosphor, and
an external connection terminal at the lower surface of the light source, and
the plurality of light sources are ranked in terms of at least one of luminous flux or chromaticity;
an extracting step comprising extracting a plurality of light sources in a desired rank from the plurality of light sources; and
a bonding step comprising bonding the lateral surfaces of adjacent ones of the plurality of extracted light sources via a bonding member such that the upper surfaces and the lower surfaces of the light sources are exposed from the bonding member and such that the bonding member is spaced apart from the external connection terminals.

2. The method of manufacturing a light-emitting device according to claim 1, the method further comprising, before the providing step:
a collective body providing step comprising providing a collective body of light sources, the collective body comprising a plurality of light-emitting portions at an upper surface of the collective body of light sources;
a singulation step comprising dividing the collective body between adjacent ones of the light-emitting portions into the plurality of light sources; and
a classification step comprising, after the singulation step, measuring at least one of luminous flux or chromaticity of the light sources and ranking the light sources based on the at least one of luminous flux or chromaticity measured.

3. The method of manufacturing a light-emitting device according to claim 2, wherein, in the bonding step, cut surfaces formed in the singulation step are bonded with the cut surfaces facing each other.

4. The method of manufacturing a light-emitting device according to claim 1, wherein, in the bonding step, the bonding member covers the entirety of the lateral surfaces of the adjacent ones of the plurality of light sources.

5. The method of manufacturing a light-emitting device according to claim 1, wherein, in the bonding step, the bonding member bonds light sources having different emission colors.

6. The method of manufacturing a light-emitting device according to claim 1, wherein, in the bonding step, the bonding member bonds light sources configured to emit light having a same color.

7. The method of manufacturing a light-emitting device according to claim 1 wherein, in the bonding step, the light-emitting portions of the plurality of light sources are arranged in a matrix.

8. The method of manufacturing a light-emitting device according to claim 1, wherein each of the light sources further comprises:
a substrate; and
a covering member from which an upper surface of the light-transmissive member is exposed, the covering member covering lateral surfaces of the light-transmissive member,
wherein the light-emitting element is disposed on the substrate.

9. The method of manufacturing a light-emitting device according to claim 8, wherein the substrate comprises a ceramic substrate.

10. The method of manufacturing a light-emitting device according to claim 8, wherein the bonding member contains a material having a light transmittance lower than a light transmittance of the covering member.

11. The method of manufacturing a light-emitting device according to claim 1, wherein, in the bonding step, the bonding member contains a light-absorbing substance.

12. The method of manufacturing a light-emitting device according to claim 2, wherein:
in the singulation step, the collective body is divided between adjacent ones of the light-emitting portions by using a blade, and
in the bonding step, a width of the bonding member disposed between lateral surfaces of the adjacent ones of the light sources is smaller than a cut width of the blade.

13. The method of manufacturing a light-emitting device according to claim 1, wherein, in the bonding step, the bonding member is located between respective light-transmissive members in the plurality of light sources in a section view.

14. The method of manufacturing a light-emitting device according to claim 1, wherein, in the bonding step, the bonding member constitutes a part of an upper surface of the light-emitting device.

15. The method of manufacturing a light-emitting device according to claim 3, wherein: in the bonding step, the bonding member: covers the entirety of the lateral surfaces of the adjacent ones of the plurality of light sources; contains a light-absorbing substance; is located between respective light-transmissive members in the plurality of light sources in a section view; and constitutes a part of an upper surface of the light-emitting device, and
each of the light sources further comprises:
a substrate; and
a covering member from which an upper surface of the light-transmissive member is exposed, the covering member covering lateral surfaces of the light-transmissive member,
wherein the light-emitting element is disposed on the substrate.

16. The method of manufacturing a light-emitting device according to claim 3, wherein:
in the bonding step,
the bonding member: covers the entirety of the lateral surfaces of the adjacent ones of the plurality of light sources; contains a light-absorbing substance; is located between each light-transmissive member in the plurality of light sources in a plan view; and constitutes a part of an upper surface of the light-emitting device,
the light-emitting portions of the plurality of light sources are arranged in a matrix, and
a width of the bonding member disposed between lateral surfaces of the adjacent ones of the light sources is smaller than a cut width of a blade,
in the singulation step, the collective body is divided between adjacent ones of the light-emitting portions by using the blade, and each of the light sources further comprises:
a substrate; and
a covering member from which an upper surface of the light-transmissive member is exposed, the covering member covering lateral surfaces of the light-transmissive member,
wherein the light-emitting element is disposed on the substrate.

17. The method of manufacturing a light-emitting device according to claim 3, wherein,
in the bonding step,
the bonding member: covers the entirety of the lateral surfaces of the adjacent ones of the plurality of light sources; contains a light-absorbing substance; is located between respective light-transmissive members in the plurality of light sources in a section view; and constitutes a part of an upper surface of the light-emitting device,
the light-emitting portions of the plurality of light sources are arranged in a matrix, and
a width of the bonding member disposed between lateral surfaces of the adjacent ones of the light sources is smaller than a cut width of a blade, in the singulation step, the collective body is divided between adjacent ones of the light-emitting portions by using the blade, each of the light sources further comprises:
   a substrate; and
   a covering member from which an upper surface of the light-transmissive member is exposed, the covering member covering lateral surfaces of the light-transmissive member,
   wherein the light-emitting element is disposed on the substrate, and the substrate comprises a ceramic substrate.

18. The method of manufacturing a light-emitting device according to claim 3, wherein, in the bonding step,
   the bonding member: covers the entirety of the lateral surfaces of the adjacent ones of the plurality of light sources; bonds the light sources configured to emit light having the same color; contains a light-absorbing substance; is located between each light-transmissive member in the plurality of light sources in a plan view; and constitutes a part of an upper surface of the light-emitting device, the light-emitting portions of the plurality of light sources are arranged in a matrix, and a width of the bonding member disposed between lateral surfaces of the adjacent ones of the light sources is smaller than a cut width of a blade, in the singulation step, the collective body is divided between adjacent ones of the light-emitting portions by using the blade, each of the light sources further comprises:
   a substrate; and
   a covering member from which an upper surface of the light-transmissive member is exposed, the covering member covering lateral surfaces of the light-transmissive member,
   wherein the light-emitting element is disposed on the substrate, and the substrate comprises a ceramic substrate.

\* \* \* \* \*